United States Patent
Sugiyama et al.

(10) Patent No.: US 6,733,620 B1
(45) Date of Patent: May 11, 2004

(54) PROCESS APPARATUS

(75) Inventors: Norikazu Sugiyama, Higashiyatsushiro-gun (JP); Nobuyuki Okayama, Nirasaki (JP); Hidehito Saegusa, Higashiyatsushiro-gun (JP); Jun Ozawa, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 5 days.

(21) Appl. No.: 09/655,705

(22) Filed: Sep. 6, 2000

Related U.S. Application Data (63) Continuation of application No. PCT/JP99/01055, filed on Mar. 4, 1999.

(30) Foreign Application Priority Data

Mar. 6, 1998 (JP) ............................................. 10-073433
Jun. 11, 1998 (JP) ............................................. 10-179616

(51) Int. Cl.[7] ............................ H05H 1/00; C23C 16/00
(52) U.S. Cl. ........................... 156/345.29; 156/345.26; 118/715
(58) Field of Search ............................. 118/715, 723 E, 118/723 R, 723 ER; 156/345.29, 345.33, 345.47, 345.26

(56) References Cited

U.S. PATENT DOCUMENTS

| | | | | |
|---|---|---|---|---|
| 5,441,568 A | * | 8/1995 | Cho et al. ................... | 118/715 |
| 5,529,632 A | * | 6/1996 | Katayama et al. .... | 118/723 MP |
| 5,589,002 A | * | 12/1996 | Su .......................... | 118/723 E |
| 5,605,637 A | | 2/1997 | Shan | |
| 5,904,800 A | * | 5/1999 | Mautz ......................... | 156/345 |
| 6,051,100 A | * | 4/2000 | Walko, II .................... | 156/345 |
| 6,159,333 A | * | 12/2000 | Gupta et al. ................. | 156/345 |
| 6,176,969 B1 | * | 1/2001 | Park et al. ................... | 156/345 |
| 6,178,919 B1 | * | 1/2001 | Li et al. .................. | 118/723 E |

FOREIGN PATENT DOCUMENTS

| | | |
|---|---|---|
| JP | 59-82958 | 5/1984 |
| JP | 63-141318 | 6/1988 |
| JP | 4-358518 | 12/1992 |
| JP | 8-279399 | 10/1997 |
| JP | 10-41096 | 2/1998 |

* cited by examiner

*Primary Examiner*—Parviz Hassanzadeh
(74) *Attorney, Agent, or Firm*—Morrison & Foerster LLP (57) ABSTRACT

The present invention provides a process apparatus including an airtight process vessel, an exhaust system for exhausting gas from the process vessel, and a baffle plate for partitioning the process vessel into a process chamber for processing an object and an exhaust passage communicating with the exhaust system, the baffle plate has a plurality of slits through which the process chamber and the exhaust passage communicate with each other, and each of the slits has a tapered surface on an inner surface toward the process chamber, the tapered surface corresponding to not less than ¼ of a depth of the slit.

16 Claims, 8 Drawing Sheets

PROCESS APPARATUS

CROSS-REFERENCE TO RELATED APPLICATIONS

This is a Continuation of Application PCT/JP99/01055, filed Mar. 4, 1999.

This application is based upon and claims the benefit of priority from the prior Japanese Patent Applications No. 10-073433, filed Mar. 6, 1998; and No. 10-179616, Jun. 11, 1998, the entire contents of which are incorporated herein by reference.

BACKGROUND OF THE INVENTION

The present invention relates to a process apparatus for performing a process, such as etching, on an object such as a semiconductor wafer.

A magnetron-type plasma process apparatus that is generally known comprises a gas-tight process vessel, an upper electrode provided in the vessel, a lower electrode provided in the vessel and opposing the upper electrode, and a magnet surrounding a plasma region provided between the upper and lower electrodes.

To perform a plasma process on an object by the use of such a magnetron-type plasma process apparatus, the object is mounted on the lower electrode. Then, the process gas is introduced into the process vessel. The process vessel is evacuated, whereby a low-pressure atmosphere is maintained in the vessel. Thereafter, high-frequency power is supplied to the lower electrode, thereby generating plasma in the process vessel.

Generally, a plasma process apparatus of this type has a baffle plate, which partitions the process vessel into a process chamber and an exhaust passage. An object to be processed is placed in the process chamber. The exhaust passage communicates with an evacuation mechanism. The baffle plate is provided between the side of the lower electrode and the inner surface of the process vessel and surrounds the lower electrode. The baffle plate has a plurality of slits that extend in the radial direction, connecting the process chamber and the exhaust passage. (The chamber and the passage communicate with each other through these slits.) Thus, the baffle plate partitions the plasma region while the process is undergoing. This increases the density of plasma in the process chamber. Further, the conductance between the process chamber and the exhaust passage is maintained in a prescribed condition since the gas is guided from the chamber into the passage through the slits. Thus, the gas can be exhausted from the process chamber in a stable condition.

The baffle plate has the function of holding the reaction product made by the process, thus reducing the amount in which the reaction product flows into the exhaust passage. The reaction product deposits on that surface of the baffle plate which is exposed to the process chamber (i.e., the surface of the plate facing the chamber). The amount of deposition is proportional to the time of process. If the product deposits on the rims of the slits through which the gas flows from the process chamber, the slits will become narrower. Consequently, the pressure in the process chamber will rise. This impairs the uniformity of etching in the plane of the object (i.e., in-plane uniformity) or decrease the etching rate. To prevent such undesirable events, the maintenance of the baffle plate is effected at regular intervals, by either washing the plate or by replacing it with a new one. If the process generates deposit in large quantities, however, the maintenance must be carried out more frequently. In this case, the throughput of the process will decrease.

BRIEF SUMMARY OF THE INVENTION

The object of the invention is to provide a novel, improved process apparatus in which the slits of the baffle plate are hardly narrowed with deposit on the chamber side, an atmosphere of a prescribed pressure can therefore be maintained in the process chamber for a long time (that is, the process time can be lengthened without changing the process conditions), and the maintenance cycle of the baffle plate can be thereby extended to enhance the throughput of the process.

To attain the object, a process apparatus according to the present invention includes an airtight process vessel, an exhaust system for exhausting gas from the process vessel, and a baffle plate for partitioning the process vessel into a process chamber for processing an object and an exhaust passage communicating with the exhaust system. The baffle plate has a plurality of slits through which the process chamber and the exhaust passage communicate with each other, and each of the slits has a tapered surface on an inner surface toward the process chamber, the tapered surface being formed to not less than ¼ of a depth of the slit.

In particular, when the tapered surface is not less than ½ of the depth of the slit, it is preferable that angle θ between the tapered surface and a perpendicular crossing an open end of the slit at right angles fall within a range from 5° to 30° (5°≦θ≦30°).

When each slit has an enlarged opening facing the exhaust passage, extending from an opening rim of the slit, which faces the exhaust passage, toward the process chamber, and having an inside diameter which is larger than the minimum inside diameter of a process-chamber-side portion of the slit on which the tapered surface is formed, it is preferable that the tapered surface and the enlarged opening be each formed to ¼ to ½ of the depth of the slit and angle θ between the tapered surface and a perpendicular crossing an open end of the slit at right angles fall within a range from 30° to 60° (30°≦θ≦60°). In this case, preferably, width W1 of an opening of the slit, which faces the process chamber, and width W2 of an opening of the slit, which faces the exhaust passage, are set so as to satisfy a condition of 1≦W2/W1≦1.4.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described, with reference to the accompanying drawings.

Figure 1:
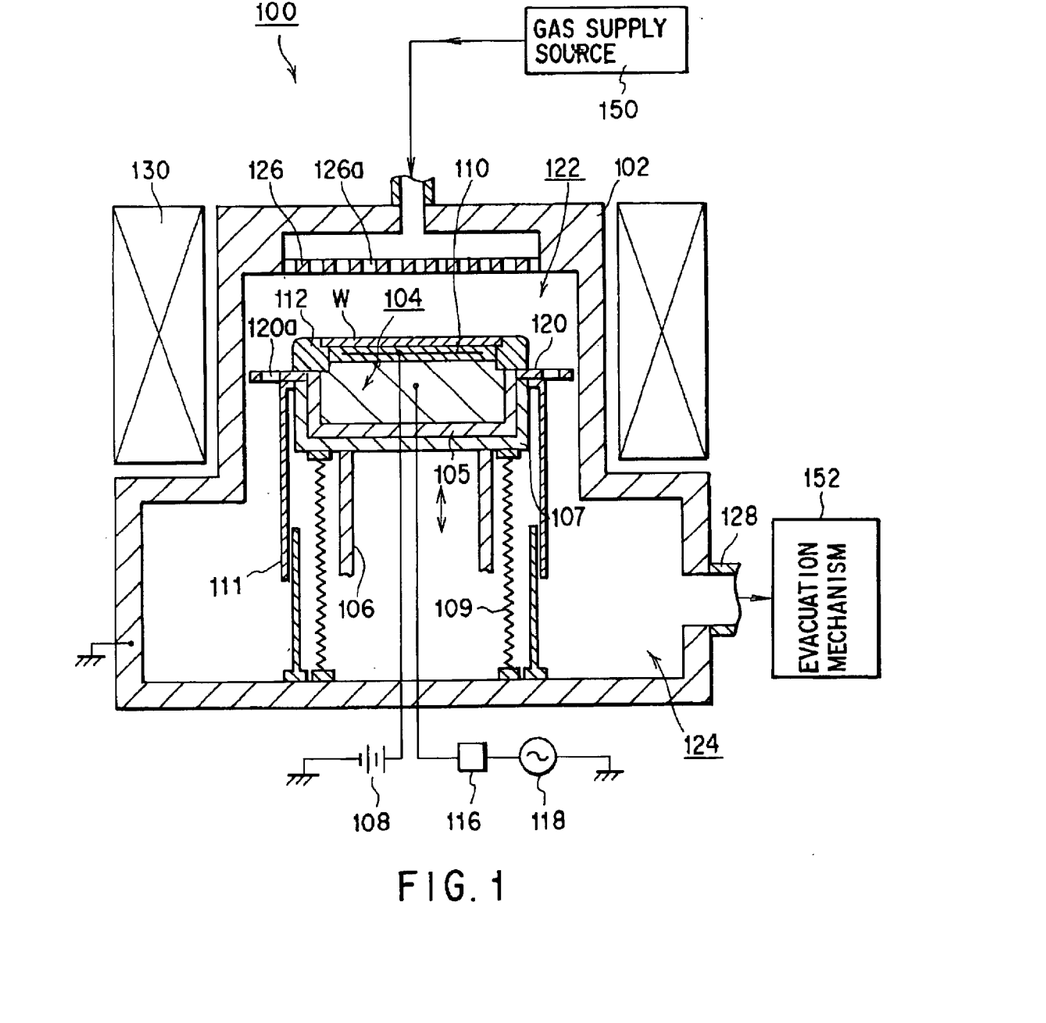
FIG. 1 is a sectional view schematically showing an etching apparatus that is an embodiment of this invention.
Figure 2:
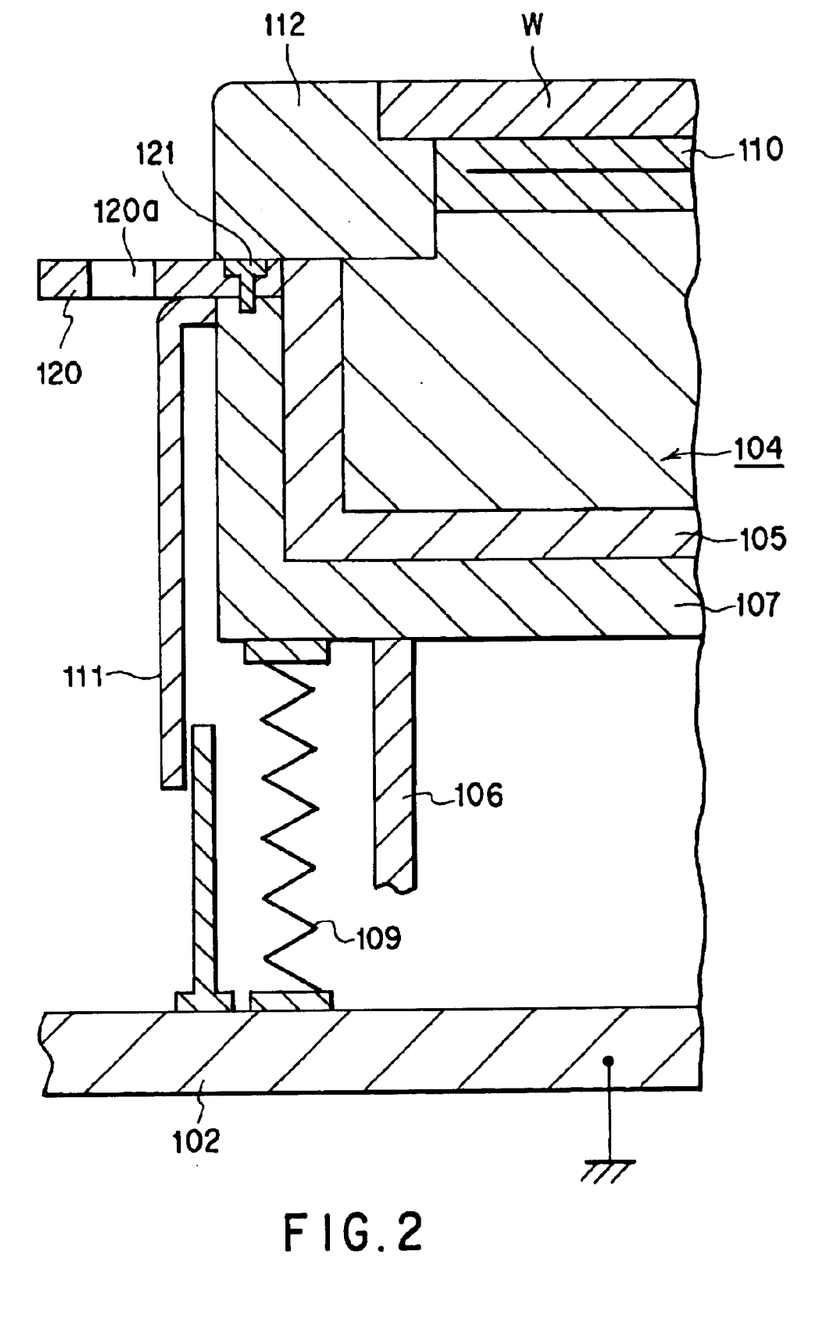
FIG. 2 is a magnified sectional view showing the edge of the lower electrode incorporated in the etching apparatus.

FIG. 1 shows a magnetron-type plasma etching apparatus that is a process apparatus according to the present invention. As shown in FIG. 1, the etching apparatus 100 has a process vessel 102 made of aluminum and connected to the ground. An oxide aluminum film has been formed on the process vessel 102 by means of, for example, anodic oxidation. A lower electrode 104 is arranged in the process vessel 102. The lower electrode 104 serves as a susceptor that has a mounting surface on which an object to be processed, e.g., a semiconductor wafer W (hereinafter referred to as "wafer"), may be mounted. As FIGS. 1 and 2 show, the lower electrode 104 is covered, except for the mounting surface, with an insulating member 105 made of, for example, ceramics, and a conductive member 107 made of, for example, aluminum. The lower electrode 104 can be moved up and down as lifting shafts 106 are driven.

Bellows 109 made of, for example, stainless steel are provided between the conductive member 107 and the process vessel 102. The conductive member 107 and process vessel 102 contact the bellows 109, with no aluminum film interposed between them and the bellows 109 (or with an aluminum film removed). Therefore, the conductive member 107 is connected to the ground by the bellows 109 and the process vessel 102. A bellows cover 111 is provided, surrounding the conductive member 107 and bellows 109. As shown in FIG. 1, an electrostatic chuck 110 connected to a high-voltage DC power supply 108 is provided on the mounting surface of the lower electrode 104. An insulating focus ring 112 is arranged, surrounding the electrostatic chuck 110. A high-frequency power supply 118 for outputting high-frequency power is connected to a matching device 116, which in turn is connected to the lower electrode 104.

An upper electrode 126 is provided on the inner surface of the process vessel 102, which opposes the mounting surface of the lower electrode 104. The upper electrode 126 has a number of gas outlet holes 126a. The gas outlet holes 126a communicate with a gas-supplying source 150 that supplies process gas. The process gas supplied from the gas-supplying source 150 is therefore introduced into a process chamber 122 through the gas outlet holes 126a. An exhaust pipe 128 is connected, at one end, to a lower port of the process vessel 102 and, at the other end, to an evacuation mechanism 152. A magnet 130 is arranged outside the process vessel 102, for confining plasma generated between the lower electrode 104 and the upper electrode 126.

As shown in FIGS. 1 and 2, a baffle plate 120 is arranged beside the lower electrode 104, partitioning the interior of the process vessel into the process chamber 122 for processing the wafer and the exhaust passage 124 communicating with the exhaust pipe 128. The baffle plate 120 is located between the circumferential surface of the lower electrode 104 and the inner surface of the process vessel 102 and surrounds the lower electrode 104. More specifically, the baffle plate 120 is clamped between the focus ring 112 and the conductive member 107. As shown in FIG. 2, the plate 120 is secured to the top of the conductive member 107 by electrically conductive screws 121.

Like the conventional baffle plate, the baffle plate 120 is made of electrically conductive material such as aluminum and has a surface oxidized by anodic oxidation. The baffle plate 120 and the conductive member 107 contact each other, with no aluminum oxide film interposed between them. In other words, the aluminum oxide film has been removed from that part of the plate 120 which contacts the conductive member 107 The baffle plate 120 is therefore connected to the ground by the conductive member 107, bellows 109 and process vessel 102 and remains at almost the same potential (ground potential) as the inner wall of the process vessel 102. As a result, the baffle plate 120 and the inner wall of the vessel 102, which is located above the baffle plate 120, function as counter electrodes of the lower electrode 104. Plasma can, therefore, be confined in a space above the baffle plate 120, that is, within the process chamber 122.

Figure 3:
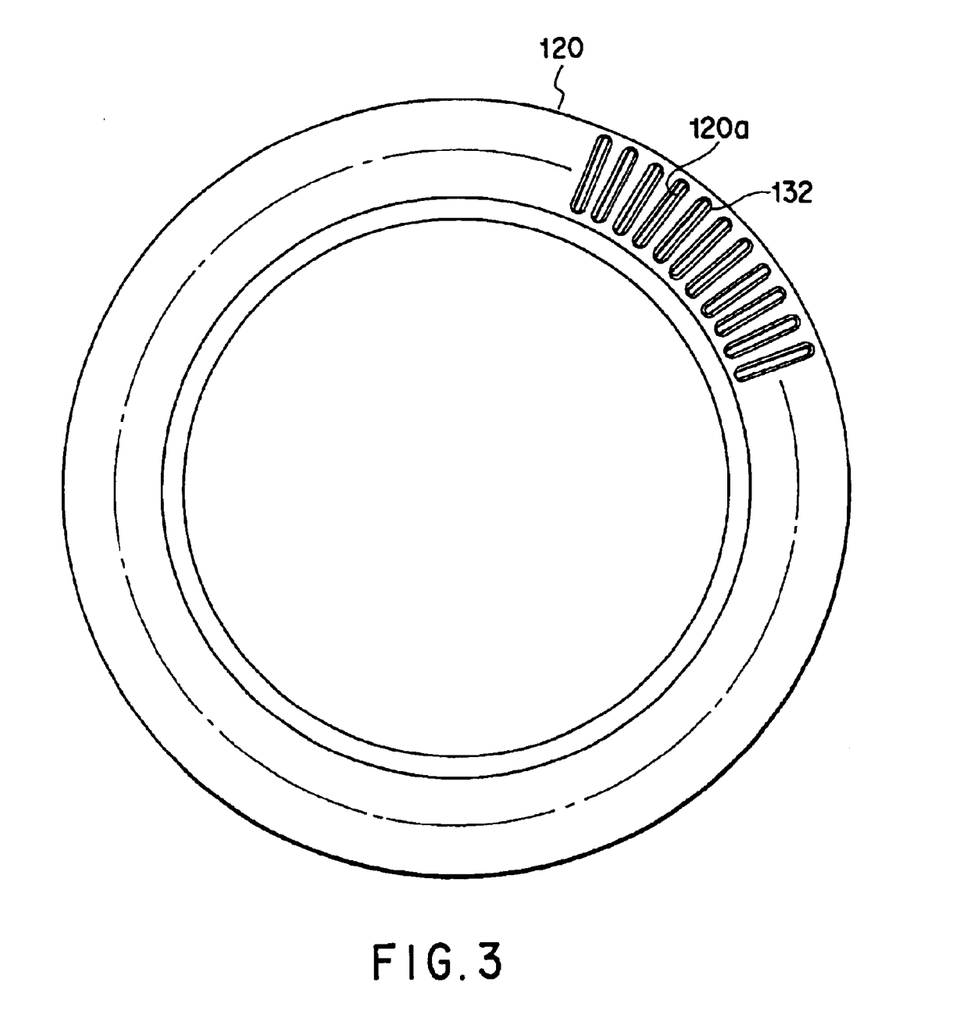
FIG. 3 is a plan view of the baffle plate provided in the etching apparatus.

As FIG. 3 shows in detail, the baffle plate 120 is shaped almost like a ring. The plate 120 has a thickness that falls within the range from 1 mm to 20 mm. In the present embodiment, the plate 120 is 3 mm thick. The baffle plate 120 has a plurality of slits, e.g., 360 slits 120a arranged on the entire circumferential surface of the plate 120 in order to cause the process chamber 122 and exhaust passage 124 to communicate with each other when the baffle plate 120 is mounted on the lower electrode 104. More precisely, the slits 120a extend in radial directions of the baffle plate 120. The number of slits 120a can be changed to any value, ranging from 180 to 540, in accordance with the process apparatus to which the baffle plate 120 is applied.

The slits 120a (arranged in the radial directions of the baffle plate 120) have a length that falls within the range from 35 mm to 45 mm. In the present embodiment, the length is set to 41 mm. The slits 120a have a width that falls within the range from 0.5 mm to 2.5 mm. In the present embodiment, the width is set to 1.6 mm. The area of the opening of each slit 120a, which faces the process chamber 122, is 25% to 75% of that of the surface (top) of the baffle plate 120 which faces the chamber 122. In the present embodiment, it is set to 54%.

As FIG. 1 illustrates, when the baffle plate 120 is arranged between the side of the lower electrode 104 and the inner surface of the process vessel 102, only the minimum gap, which does not prevent the lower electrode 104 from moving up and down, is formed between the outer surface of the baffle plate 120 and the inner surface of the process vessel 102. The gas in the process chamber 122 is therefore exhausted from the exhaust passage 124 into an exhaust pipe 128 only through the slits 120a of the baffle plate 120.

Figure 4A:
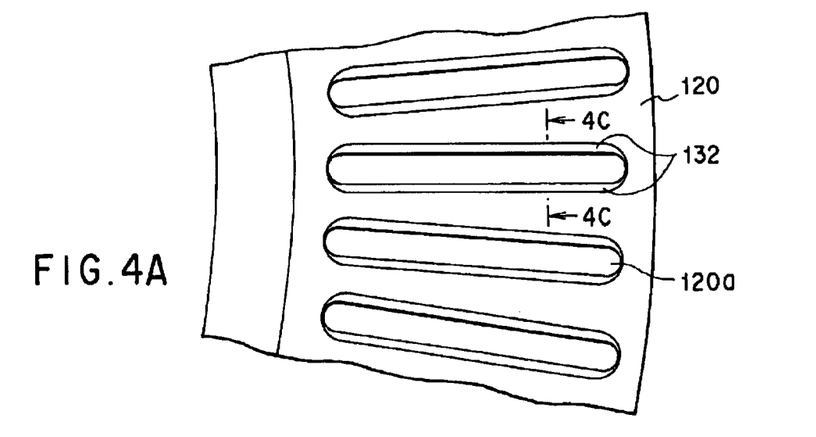
FIG. 4A is a magnified plan view of that side of the baffle plate which is exposed to the process chamber.
Figure 4B:
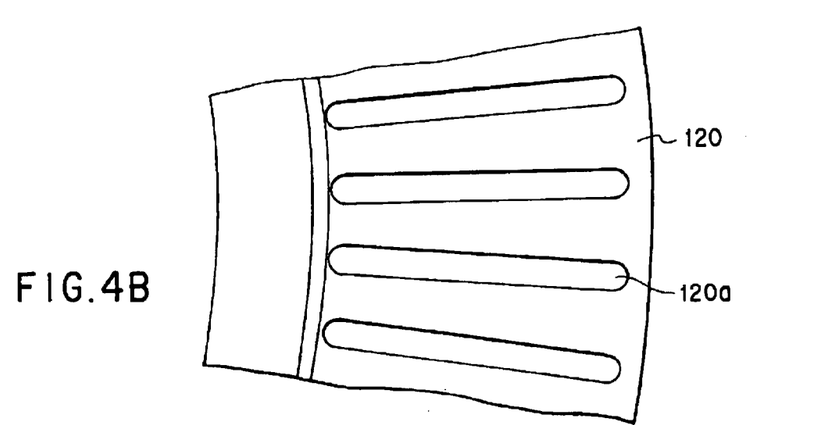
FIG. 4B is a magnified plan view of that side of the baffle plate which is exposed to the exhaust passage.
Figure 4C:
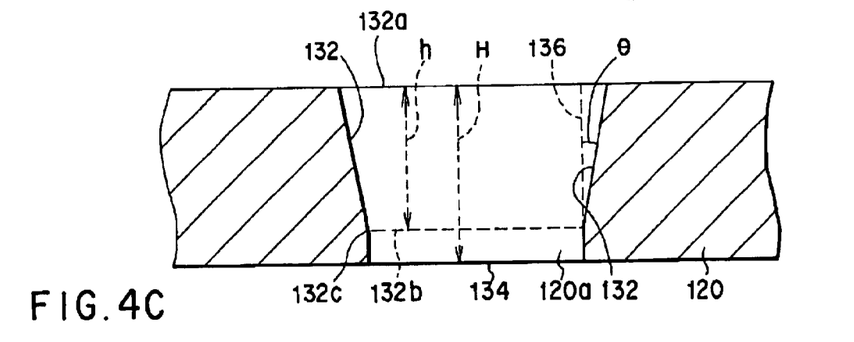
FIG. 4C is a sectional view, taken along line 4C—4C in FIG. 4A.

As shown in FIGS. 3 and 4A to 4C, each of the slits 120a has a tapered surface 132 toward the process chamber 122. The tapered surface 132 extends in the radial direction of the baffle plate 120 on either side of the slit 120a and inclines from the rim of the slit 120a, which faces the process chamber 122, toward the exhaust passage 124 in which direction the opening of the slit 120a is narrowed. As FIG. 4C shows, the distance (hereinafter referred to as "taper depth") h between an open end 132a of the slit 120a, which opposes the process chamber 122, and a region 132b surrounded by the lower rim 132c of the tapered surface 132, is substantially not less than half the distance (hereinafter referred to as "slit depth") H between the open end 132a and the other open end 134 of the slit 120a, which opposes the exhaust passage 124. In the present embodiment, the taper depth h is set to three fourths of the slit depth H. The angle (hereinafter referred to as "taper angles") θ between the tapered surface 132 and a perpendicular 136 (a line crossing the open ends 132a and 134 at right angles) falls within the range from 5° to 30° (5°≦θ30°). In the present embodiment, the angle θ is set to 10°.

Figure 6:
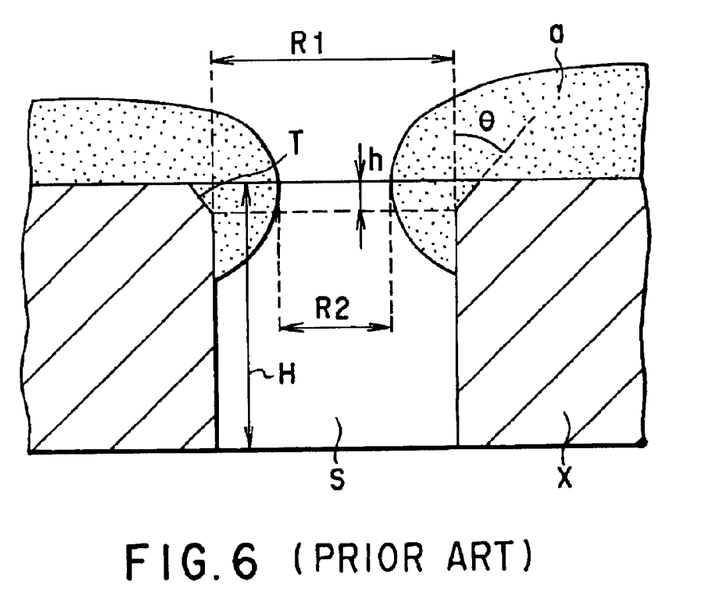
FIG. 6 is a sectional view showing the condition in which deposit lies on a conventional baffle plate.

FIG. 6 shows an example of deposit a deposited on a conventional baffle plate X. As shown, in the baffle plate X, each slit S has a tapered surface T toward the process chamber, and the tapered surface T is formed by chamfering in order to prevent the rim of the slit S from being damaged due to a plasma atmosphere. In this case, the taper depth h of the taper surface T is about one sixth of the slit depth H, while the taper angle θ of the tapered surface T is 45°. Therefore, the deposit a greatly juts into the slit S and the inside diameter R1 of the slit S is shortened in a short time (FIG. 6 shows the condition in which the inside diameter R1 of the slit S is decreased to R2 by the deposit a). The flow rate of gas passing through the slit S lowers in a relatively short time, and the pressure in the process chamber rises in a relatively short time. In other words, the uniformity of etching in the plane of a wafer W (in-plane uniformity) deteriorates in a relatively short time and the etching rate decreases in a short time, too. Consequently, the maintenance of the baffle plate X must be carried out more frequently, and the throughput of the process will decrease.

Figure 5:
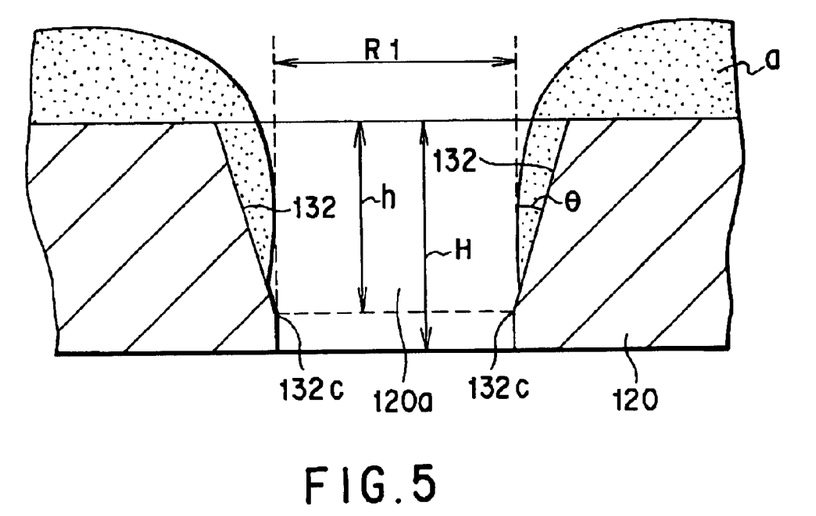
FIG. 5 is a sectional view illustrating the condition in which deposit lies on the baffle plate of FIG. 3.

FIG. 5 shows an example of a deposit a deposited on the baffle plate 120 of the present embodiment. If, as shown, the taper depth h is not less than half the slit depth H and the taper angle θ ranges from 5° to 30° (5°≦θ≦30°), the deposit a is deposited gradually from the top of the tapered surface 132. The opening of the slit 120a, which faces the process chamber 122, is hardly narrowed by the deposit a, and it takes a considerably long time to make the inside diameter of the slit 120a smaller than the prescribed value R1. In other words, the gas in the process chamber 122 is allowed to pass through the slit 120a without resistance for a long time, and a given pressure is maintained in the process chamber 122 for a long time (the process time can be lengthened more than the conventional one without changing any process conditions). Consequently, the uniformity of etching in the plane of the wafer W (in-plane uniformity) is maintained for a long time, as is the high etching rate. The maintenance cycle of the baffle plate 120 can be extended to enhance the throughput of the process (by securing a long time for which the baffle plate 120 can be processed continuously without maintenance or exchange). The following are experimental data to support the advantages of the baffle plate 120 of the present invention.

EXPERIMENTAL DATA

The experiment was performed under the same process (etching) conditions when two baffle plates to be compared were attached separately to the same plasma etching apparatus 100 (see FIG. 1).

[Objects to be Compared]
* Baffle plate 120 of the present invention (see FIGS. 3 and 4)
  Taper depth h . . . ¾ of slit depth H
  Taper angle θ . . . 10°
* Conventional baffle plate X (see FIG. 6)
  Taper depth h . . . ⅙ of slit depth H
  Taper angle θ . . . 45°
  Note: The conventional baffle plate X is the same as the baffle plate 120 except for taper depth h and taper angle θ.

[Process Conditions]
* Object to be processed: 200 mm-diameter semiconductor wafer W made of silicon (Si), on the surface of which a silicon oxide film ($SiO_2$ film) to be etched is formed.
* Etching gas: a mixture of $C_4F_8$ having a flow rate of 16 sccm, CO having a flow rate of 300 sccm, and Ar having a flow rate of 400 sccm.
* Temperature of mounting surface of lower electrode 104: 20° C
* Temperature of inner surface of process vessel 102 including upper electrode 126: 60° C.
* High-frequency power applied to lower electrode 104: 13.56 MHz, 1700W Experimental Data 1

Figure 7:
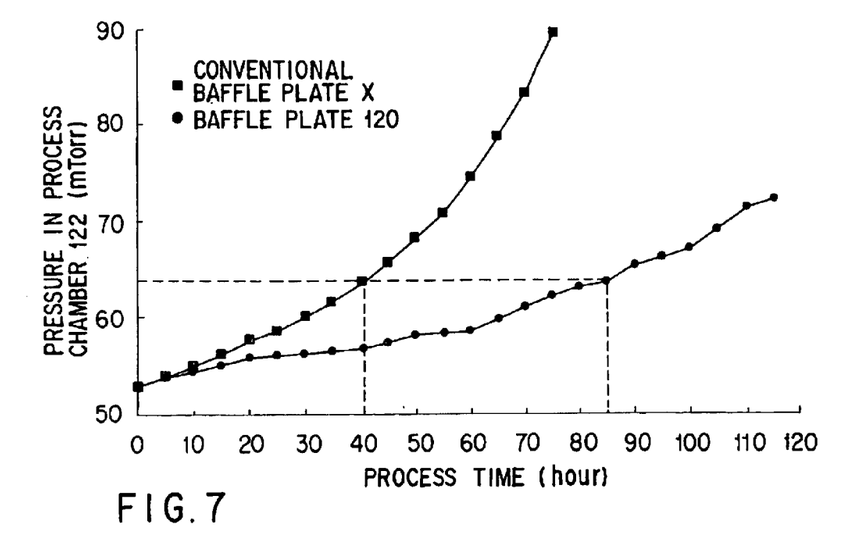
FIG. 7 is a graph representing how the pressure changed with process time during the experiments conducted in a process chamber partitioned by the baffle plate of FIG. 3 and conducted in a process chamber partitioned by the conventional baffle plate.

FIG. 7 shows variations in pressure in process chamber 122 with process time.

(Analysis)

In the process of etching a silicon oxide film using $C_4F_8$, CO and Ar, both the etching rate and in-plane uniformity decrease when the pressure atmosphere in the process chamber 122 is 65 mTorr or higher in substance. The time required until the pressure atmosphere reaches 65 mTorr therefore corresponds to continuous process time.

As shown, when the baffle plate 120 of the present invention (present embodiment) was used, the pressure atmosphere in the process chamber 122 arrived at 65 mTorr in about 85 hours. In contrast, when the conventional baffle plate X was employed, the pressure atmosphere arrived at 65 mTorr in about 40 hours.

Though not shown, even when only the taper depth h was ½ and ¼ of the slit depth H with the taper angle θ of the tapered surface 132 at 10°, the process time required until the pressure atmosphere in the process chamber 122 reached 65 mTorr, was 70 hours or more in either case. Furthermore, even when only the taper angle θ was set at 5°, 10°, 15°, 20°, 25° and 30° with the taper depth h of the tapered surface 132 ¾ of the slit depth H, the process time required until the pressure atmosphere in the process chamber 122 reached 65 mTorr, was 60 hours or more in either case.

(Conclusion)

If, as the above results, the taper depth h of the tapered surface 132 is set properly within the range of ½ to ¼ of the slit depth H or the taper angle θ is set properly within the range of 5° to 30°, the continuous process time can be extended more greatly than using the conventional baffle plate X. If, in particular, the baffle plate 120 is used, the continuous process time can be extended two or more times as long as that in the case of the conventional baffle plate.

Experimental Data 2

Figure 8:
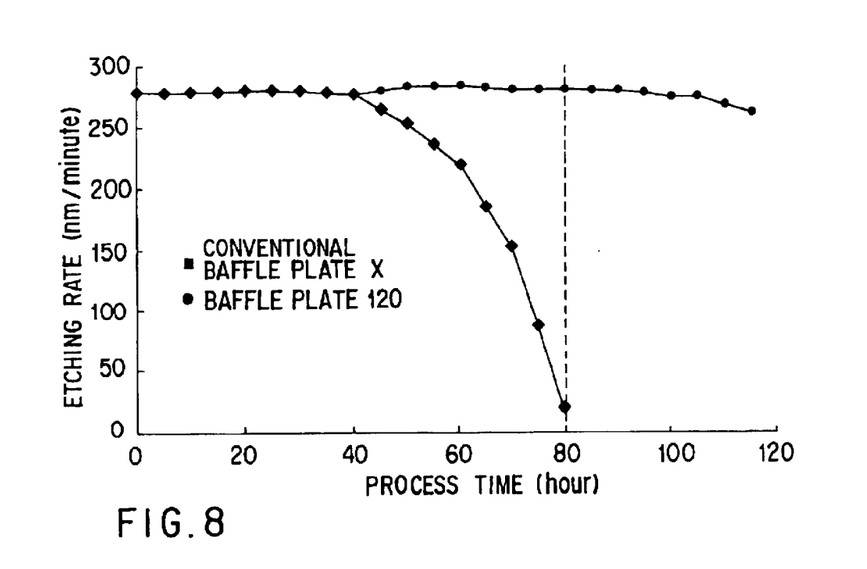
FIG. 8 is a graph illustrating how the etching rate changed with process time during the experiments conducted in a process chamber partitioned by the baffle plate of FIG. 3 and conducted in a process chamber partitioned by the conventional baffle plate.

FIG. 8 shows variations in etching rate with process time.

(Analysis)

When the baffle plate 120 of the present invention (present embodiment) was used as shown, the etching process could be performed at a high etching rate of about 270 nm per minute if the process time did not exceed about 100 hours. In contrast, when the conventional baffle plate X was used, the etching process could be performed at the same etching rate as that of the present invention if the process time did not exceed about 40 hours; however, the etching rate lowered abruptly immediately after the process time exceeded 40 hours.

(Conclusion)

If the baffle plate 120 is used, a desired uniform etching rate can be achieved even after a lapse of process time which is two or more times as long as that in the case of the conventional baffle plate X.

Experimental Data 3

Figure 9:
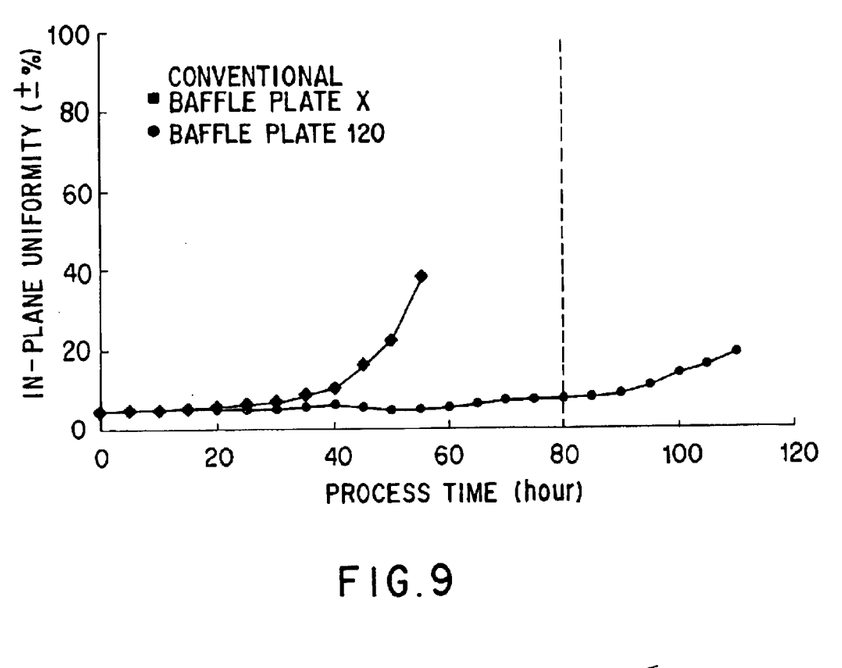
FIG. 9 is a graph showing how the uniformity of etching in the plane of an object changed with process time during the experiments conducted in a process chamber partitioned by the baffle plate of FIG. 3 and conducted in a process chamber partitioned by the conventional baffle plate.

FIG. 9 shows variations in in-plane uniformity with process time. Values of the in-plane uniformity were obtained from the following equation using the maximum and minimum values A and B of etching rates measured at a plurality of measurement points on the surface of the wafer W to be processed (including the center of the surface).

(in-plane uniformity)=±{(A−B)/(A+B)}×100[%]

As is evident from the above equation, the in-plane uniformity indicates variations in etching rate on the entire surface of the wafer W to be processed (percentage of the maximum values or the minimum values deviating from the average value). The smaller the value of the in-plane uniformity, the higher the uniformity.

(Analysis)

When the baffle plate 120 of the present invention (present embodiment) was used as shown, the in-plane uniformity of 5% could be obtained if the process time did not exceed about 80 hours. In contrast, when the conventional baffle plate X was used, the same in-plane uniformity as that of the present invention could be obtained if the process time did not exceed about 20 hours; however, the value of the in-plane uniformity increased when the process time exceeded 20 hours and it increased abruptly immediately after the process time exceeded 40 hours.

(Conclusion)

If the baffle plate 120 is used, prescribed in-plane-uniformity can be achieved even after a lapse of process time which is four or more times as long as that in the case of the conventional baffle plate X.

As has been described above, in the baffle plate 120 of the etching apparatus 100 according to the present embodiment, the taper depth h of the tapered surface 132 is set not less than half the slit depth H and the taper angle θ falls within the range from 5° to 30° (5°≦θ≦30°). Since the depth of the taper surface 132 is considerably greater (½ or more of the slit depth H in substance), the area of the tapered surface can be enlarged more greatly than that of the conventional baffle plate X, keeping the conductance of the process chamber 122 and exhaust passage 124 in prescribed conditions. Since, moreover, the taper angle θ falls within the range from 5° to 30° (5°≦θ≦30°), a deposit is formed effectively on the tapered surface 132.

Therefore, a deposit such as a reaction product is formed on the baffle plate 120 in sequence from the top of the tapered surface 132, and the openings of the slits 120a, which face the process chamber 122, are hardly narrowed by the deposit. For this reason, gas in the process chamber 122 can be caused to pass through the slits 120a for a long time without resistance and a given process pressure is maintained in the process chamber 122 for a long time (it is possible to extend time required until a pressure atmosphere of the process chamber 122 increases due to clogging of the slits 120a). In other words, the process time can be extended longer than that in the prior art without changing process conditions. Consequently, as is evident from the above experimental data, the in-plane uniformity and etching rate of the wafer W can be maintained high for a long time, and the maintenance cycle of the baffle plate 120 can be extended more greatly than that in the prior art to improve the throughput of the process.

In the present embodiment, the inside diameter of each slit 120a is not increased but the slit 120a has a large tapered surface 132 with a given depth and angle which opposes the process chamber 122. Thus, the process time can be extended without exercising an influence on the conductance in the process chamber 122 and exhaust passage 124.

Figure 10A:
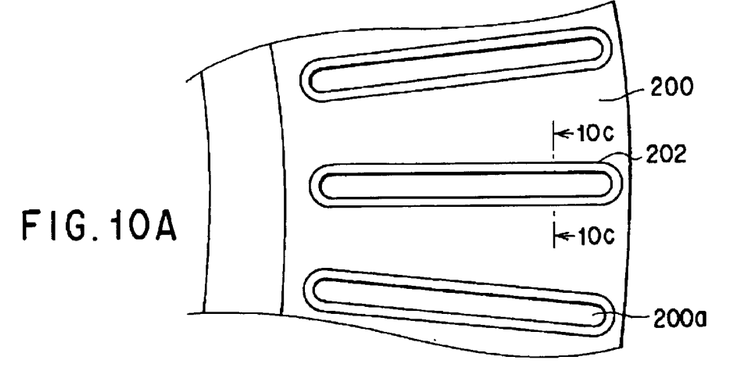
FIG. 10A is a magnified plan view depicting that surface of a modification of the baffle plate shown in FIG. 3, which is exposed to the process chamber.
Figure 10B:
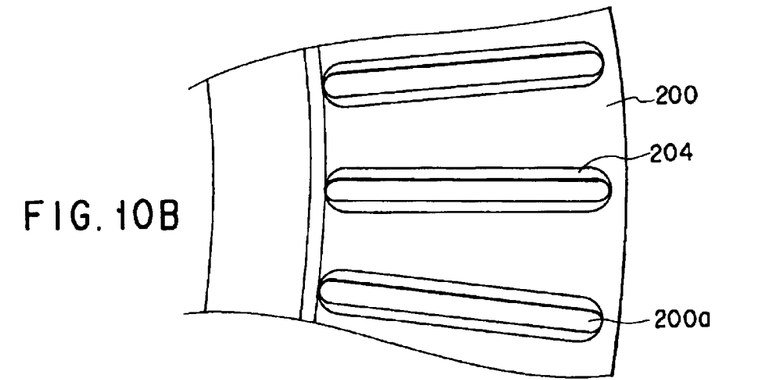
FIG. 10B is a magnified plan view showing that surface of the modification of the baffle plate shown in FIG. 3, which is exposed to the exhaust passage.
Figure 10C:
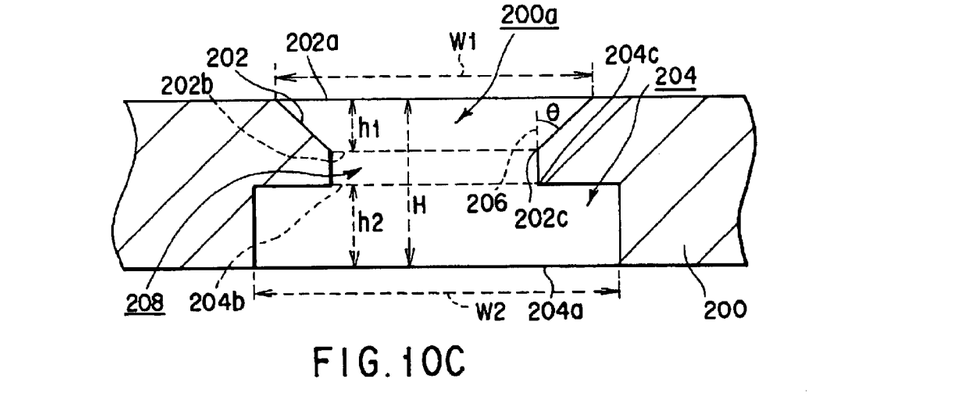
FIG. 10C is a sectional view taken along line 10C—10C in FIG. 10.

FIGS. 10A to 10C illustrate a modification to the baffle plate of the embodiment described above.

In a baffle plate 200 of the modification shown in FIGS. 10A to 10C, a plurality of slits 200a are arranged on the entire circumferential surface of the plate 200 in order to cause the process chamber 122 and exhaust passage 124 to communicate with each other when the baffle plate 200 is mounted on the lower electrode 104. More specifically, the slits 200a extend in radial directions of the baffle plate 200. As shown in FIGS. 10A and 10C, each of the slits 200a has a tapered surface 202 toward the process chamber 122. As illustrated in FIGS. 10B and 10C, an enlarged opening 204 is provided toward the exhaust passage 124 of the slits 200a.

As FIGS. 10A and 10C illustrate, the tapered surface 202 extends in the radial direction of the baffle plate 200 on either side of the slit 200a and inclines from the rim of the slit 200a, which faces the process chamber 122, toward the exhaust passage 124 in which direction the opening of the slit 200a is narrowed. The distance between an open end 202a of the slit 200a, which opposes the process chamber 122, and a region 202b surrounded by the lower rim 202c of the tapered surface 202, i.e., the taper depth h1 is substantially ¼ to ½ of the distance between the open end 202a and the other open end 204a of the slit 200a (enlarged opening 204), which opposes the exhaust passage 124, i.e., the slit depth H. In the present modification, the taper depth h1 is set to one third of the slit depth H. The angle between the tapered surface 202 and a perpendicular 206, i.e., the taper angle θ falls within the range from 30° to 60° (30°≦θ≦60°) in substance. In the present modification, the angle θ is set to 45°.

As FIGS. 10B and 10C illustrate, the enlarged opening 204 is shaped almost like a trench and formed along the radial direction of the baffle plate 200 alongside the exhaust passage 124 of the slit 200a. The distance h2 between the open end 204a of the opening 204, which opposes the exhaust passage 124, and a region 204b surrounded by a bottom rim 204c of the opening 204 (hereinafter referred to as "enlarged opening depth") is ¼ to ½ of the slit depth H in substance. Particularly, in the present modification, the distance h2 is set to ½ of the slit depth H. The area of the open end 204a of the enlarged opening 204 is set larger than that of the region 202b of the lower rim 202c of the tapered surface 202. Moreover, the width W1 of the slit 200a, which faces the process chamber 122, and the width W2 of the slit 200a, which faces the exhaust passage 124, are set so as to satisfy the condition of 1≦W2/W1≦1.4 in substance. Particularly, in the present modification, W2/W1 is set at 1.2.

That portion of the slit 200a with the tapered surface 202 which faces the process chamber 122 and that portion of the slit 200a with the enlarged opening 204 which faces the exhaust passage 124 communicate with each other through a passage 208 having the same section and size as those of the region 202b surrounded by the lower rim 202c of the tapered surface 202.

The baffle plate 200 having the above-described structure was applied to the etching apparatus 100 shown in FIG. 1 and the wafer W (which is identical with that used in the above experiments) was processed by etching under the same process conditions as those of the above experiments. It was 60 hours or longer before the pressure atmosphere in the process chamber 122 reached 65 mTorr. Even when the same experiments were carried out by changing only the taper angle θ of the tapered surface to 30°, 40°, 50° and 60°, it was 60 hours or longer before the pressure atmosphere in the process chamber 122 reached 65 mTorr in each case. If, therefore, the taper angle θ of the tapered surface 202 is properly set within the range from 30° to 60° in substance in the baffle plate 200 having the enlarged opening 204, the continuous process time can be extended more greatly than using the conventional baffle plate X. Further, even when the same experiments were performed by changing only the value of W2/W1 to 1 and 1.4, it was 60 hours or longer before the pressure atmosphere in the process chamber 122 reached 65 mTorr in either case. If, therefore, W2/W1 is properly set within the range from 1 to 1.4 in substance in the baffle plate 200 having the enlarged opening 204, the continuous process time can be extended more greatly than using the conventional baffle plate X.

As described above, in the baffle plate 200 according to the present modification, the taper depth h1 of the tapered surface 202 is ¼ to ½ of the slit depth H and the taper angle θ falls within the range from 30° to 60° (30°≦θ≦60°). The depth of the tapered surface 202 is therefore considerably greater, the area of the tapered surface can be enlarged more greatly than that of the conventional baffle plate X, keeping the conductance of the process chamber 122 and exhaust passage 124 in prescribed conditions. Since, moreover, the taper angle θ falls within the range from 30° to 60° (30°≦θ≦60°), a deposit is formed effectively on the tapered surface 202.

Therefore, a deposit such as a reaction product is formed on the baffle plate 200 in sequence from the top of the tapered surface 202, and the openings of the slits 200a, which face the process chamber 122, are hardly narrowed by the deposit. For this reason, gas in the process chamber 122 can be caused to pass through the slits 200a for a long time without resistance and a given process pressure is maintained in the process chamber 122 for a long time. In other words, the process time can be extended longer than that in the prior art without changing process conditions. Consequently, the in-plane uniformity and etching rate of the wafer W can be maintained high for a long time, and the maintenance cycle of the baffle plate 200 can be extended more greatly than that in the prior art to improve the throughput of the process.

In particular, the baffle plate 200 of the present modification has the enlarged opening 204 having a large opening area toward the exhaust passage 124 of the slit 200a and the depth h2 of the enlarged opening is set to ¼ to ½ of the slit depth H in substance. Consequently, a small-diameter portion in the slit 200a on which a deposit is easily formed, can be decreased, and time can be extended further until the process chamber 122 increases in pressure. Since, in the present modification, the area of the open end 204a of the enlarged opening 204 is set larger than that of the 1s region 202b surrounded by the lower rim 202c of the tapered surface 202, gas can be uniformly guided to the exhaust passage 124 through the slits 200 without any disturbance.

According to the present modification, the width W1 of the slit 200a, which faces the process chamber 122, and the width W2 of the slit 200a, which faces the exhaust passage 124, are set so as to satisfy the condition of 1≦W2/W1≦1.4 in substance. Therefore, time can be extended further until the opening of the slit 200a is narrowed by the deposit, without exercising an influence on the conductance in the process chamber 122 and exhaust passage 124.

In the present modification, that portion of the slit 200a with the tapered surface 202 which faces the process chamber 122 and that portion of the slit 200a with the enlarged opening 204 which faces the exhaust passage 124 communicate with each other through the passage 208 having the same section and size as those of the region 202b surrounded by the lower rim 202c of the tapered surface 202. The conductance in the process chamber 122 and exhaust passage 124 can thus be maintained in a desired condition even though the slit 200a is provided with the tapered surface 202 and enlarged opening 204.

Figure 11:
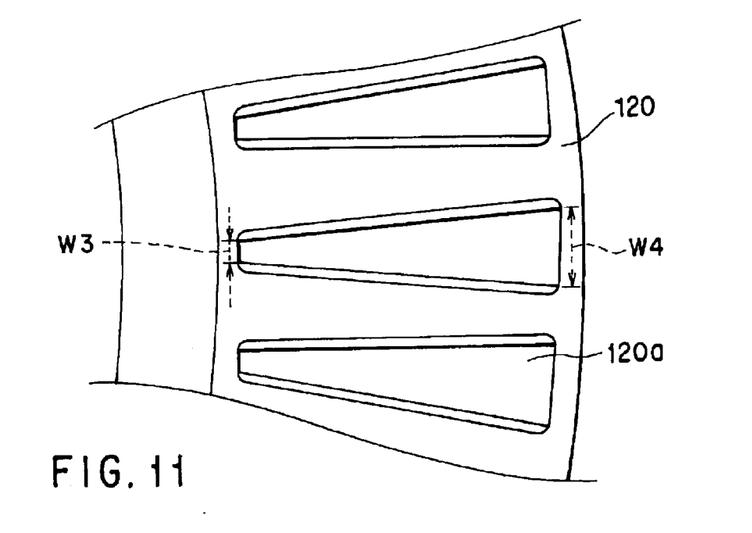
FIG. 11 is a plan view showing a baffle plate having slits of a modified shape.

The present invention is not limited to the foregoing embodiment and modification. It is needless to say that various changes and modifications can be made without departing from the scope of the subject matter of the present invention. In the above embodiment, the width of the slit 120a is constant on both the inner and outer sides of the baffle plate 120; however, it can be varied as shown in FIG. 11. In the example of FIG. 11, width W4 on thee outer side is set greater than width W3 on the inner side. In the above embodiment and modification, corner portions are formed at the upper rim (opening rim) of the tapered surface 132 (202), the lower rim 132c (202c) of the tapered surface 132 (202), the bottom of the enlarged opening 204, and the open end 204a of the opening 204; however, these corner portions can be chamfered. In the embodiment described above, the wafer is processed by etching by $C_4F_8$, CO and Ar. The present invention can be applied to another process apparatus such as a plasma CVD apparatus and a process of another object such as an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A process apparatus including an airtight process vessel, an exhaust system for exhausting gas from the process vessel, and a baffle plate for partitioning the process vessel into a process chamber for processing an object and an exhaust passage communicating with the exhaust system, wherein the baffle plate includes a plurality of slits through which the process chamber and the exhaust passage communicate with each other, wherein each slit includes an exhaust-passage opening facing the exhaust passage and a process-chamber opening facing the process chamber, wherein at least one side of said process-chamber opening includes a sloped inner surface at least along the slit length, said sloped inner surface of the process-chamber opening formed not more than ½ of the thickness of the baffle plate and widens towards the process-chamber opening, wherein at least one side of said exhaust-passage opening includes an inner surface that is substantially perpendicular to the surface of the baffle plate, said inner surface of the exhaust-passage opening formed not more than ½ of the thickness of the baffle plate, and wherein the width of said exhaust-passage opening is greater than the minimum width of the process-chamber opening that is surrounded by an inner rim of the sloped inner surface.

2. The process apparatus according to claim 1, wherein the inner sloped surface of the process-chamber opening and the inner surface of the exhaust-passage opening are formed to having depths not less than ¼ of the thickness of the baffle plate.

3. The process apparatus according to claim 1, wherein the baffle plate is shaped like a ring, and the plurality of slits are arranged radially on an entire circumferential surface of the baffle plate.

4. The process apparatus according to claim 1, wherein each slit extends in a radial direction of the baffle plate, and the inner sloped surface of the process-chamber opening slopes from an opening rim of the slit, which faces the process chamber, toward the exhaust passage in which direction the opening of the slit is narrowed.

5. The process apparatus according to claim 4, wherein the exhaust-passage opening and the process-chamber opening communicate with each other through a passage having a diameter which is not larger than the minimum diameter of the process-chamber opening that is surrounded by an inner rim of the sloped surface.

6. The process apparatus according to claim 1, wherein for each slit an angle θ formed between the sloped surface and an axis perpendicular to the openings of the slit falls within a range from 5° to 30°.

7. The process apparatus according to claim 1, wherein the width W1 of the process-chamber opening and the width W2 of the exhaust-passage opening are set as to satisfy a condition of $1 \leq W2/W1 \leq 1.4$.

8. The process apparatus of claim 1, wherein the sloped inner surface of said process-chamber opening is smooth.

9. A baffle plate for partitioning a process vessel into a process chamber for processing an object and an exhaust passage communicating with the exhaust system, said baffle plate including a plurality of slits through which the process chamber and the exhaust passage communicate with each other, wherein each slit includes an exhaust-passage opening facing the exhaust passage and a process-chamber opening fag the process chamber, wherein at least one side of said process-chamber opening includes a sloped inner surface at least along the slit length, said sloped inner surface of the process-chamber opening formed not more than ½ of the thickness of the baffle plate and widens towards the process-chamber opening, wherein at least one side of said exhaust-passage opening includes an inner surface that is substantially perpendicular to the surface of the baffle plate, said inner surface of the exhaust-passage opening formed not more than ½ of the thickness of the baffle plate, and wherein the width of said exhaust-passage opening is greater than the minimum width of the process-chamber opening that is surrounded by an inner rim of the sloped inner surface.

10. The baffle plate according to claim 9, wherein the inner sloped surface of the process-chamber opening and the inner surface of the exhaust-passage opening are formed to having depths not less than ¼ of the thickness of the baffle plate.

11. The baffle plate according to claim 9, wherein the baffle plate is shaped like a ring, and the plurality of slits are arranged radially on an entire circumferential surface of the baffle plate.

12. The baffle plate according to claim 9, wherein each slit extends in a radial direction of the baffle plate, and the inner sloped surface of the process-chamber opening slopes from an opening rim of the slit, which faces the process chamber, toward the exhaust passage in which direction the opening of the slit is narrowed.

13. The baffle plate according to claim 12, wherein the exhaust-passage opening and the process-chamber opening communicate with each other through a passage having a diameter which is not larger than the minimum diameter of the process-chamber opening that is surrounded by an inner rim of the sloped surface.

14. The baffle plate according to claim 9, wherein for each silt an angle θ formed between the sloped surface and an axis perpendicular to the openings of the slit falls within a range from 5° to 30°.

15. The baffle plate according to claim 9, wherein the width W1 of the process-chamber opening and the width W2 of the exhaust-passage opening are set as to satisfy a condition of $1 \leq W2/W1 \leq 1.4$.

16. The baffle plate of claim 9, wherein the sloped inner surface of said process-chamber opening is smooth.

* * * * *